US010439602B2

(12) United States Patent
Beeston et al.

(10) Patent No.: US 10,439,602 B2
(45) Date of Patent: Oct. 8, 2019

(54) ELECTRONIC POWER SWITCH

(71) Applicant: ProGrAnalog Corporation, Beaverton, OR (US)

(72) Inventors: Roger Beeston, Portland, OR (US); David F. Baretich, Wilsonville, OR (US); Phillip Fischer, Campbell, CA (US); Quincy Chan, Cupertino, CA (US); Bob Fite, Olympia, WA (US)

(73) Assignee: ProGrAnalog Corporation, Camas, WA (US)

( * ) Notice: Subject to any disclaimer, the term of this patent is extended or adjusted under 35 U.S.C. 154(b) by 0 days.

(21) Appl. No.: 15/643,157

(22) Filed: Jul. 6, 2017

(65) Prior Publication Data

US 2018/0131362 A1    May 10, 2018

Related U.S. Application Data

(60) Provisional application No. 62/359,653, filed on Jul. 7, 2016.

(51) Int. Cl.
*H03K 17/042* (2006.01)
*G05F 1/575* (2006.01)
(Continued)

(52) U.S. Cl.
CPC ....... *H03K 17/04206* (2013.01); *G05F 1/575* (2013.01); *H01H 7/00* (2013.01);
(Continued)

(58) Field of Classification Search
CPC .......... H03K 17/04206; H03K 17/042; H03K 17/005; H03K 17/284; G05F 1/575
See application file for complete search history.

(56) References Cited

U.S. PATENT DOCUMENTS 4,638,175 A * 1/1987 Bradford ................. G06F 1/189
307/64
9,825,468 B1 * 11/2017 Bryson ..................... H02J 4/00
(Continued)

FOREIGN PATENT DOCUMENTS

CN    101202468 A    6/2008

OTHER PUBLICATIONS

International Search Report for PCT Application No. PCT/US2017/041023 Issued by the U.S. International Searching Authority on Nov. 27, 2017; pp. 1-4.
(Continued)

*Primary Examiner* — Thomas J. Hiltunen
(74) *Attorney, Agent, or Firm* — Haynes and Boone, LLP (57) ABSTRACT

In accordance with aspects of the present invention, a power control circuit includes a MAIN window comparator circuit providing a MAIN signal; an AUX window comparator circuit providing an AUX signal; a state machine receiving the MAIN signal and the AUX signal; a MAIN slew circuit coupled to drive a MAIN switch, the MAIN switch coupled between MAIN and an output; an AUX slew circuit coupled to drive an AUX switch, the AUX switch coupled between AUX and the output; wherein the state machine operates to continuously activate either the MAIN switch or the AUX switch according to the MAIN signal and the AUX signal such that the output is continuously coupled to either a MAIN input or an AUX input with minimum disruption to output voltage, input and output capacitance inrush currents or reverse conduction. What really makes the circuit unique is it is combined with an adjustable forward biased rectification circuit for each channel of MAIN and AUX.

15 Claims, 6 Drawing Sheets

(51) Int. Cl.
*H01H 7/00* (2006.01)
*H03K 5/04* (2006.01)
*H03K 17/00* (2006.01)
*H03K 17/284* (2006.01)
*H03K 17/22* (2006.01)

(52) U.S. Cl.
CPC ............ *H03K 5/04* (2013.01); *H03K 17/005* (2013.01); *H03K 17/284* (2013.01); *H03K 17/223* (2013.01)

(56) References Cited

U.S. PATENT DOCUMENTS

| | | | |
|---|---|---|---|
| 9,893,724 B2* | 2/2018 | Nguyen | H03K 17/162 |
| 2011/0260538 A1 | 10/2011 | Huang | |
| 2012/0187869 A1 | 7/2012 | Angelin et al. | |
| 2013/0021828 A1 | 1/2013 | Gaknoki et al. | |
| 2015/0022258 A1* | 1/2015 | Sadate | H03K 17/284 |
| | | | 327/398 |
| 2015/0194886 A1* | 7/2015 | Zanetta | H02M 3/158 |
| | | | 327/309 |
| 2016/0124478 A1 | 5/2016 | Beeston et al. | |
| 2017/0185094 A1* | 6/2017 | Atkinson | G05F 1/59 |
| 2017/0346299 A1* | 11/2017 | Sridhar | H02J 4/00 |
| 2018/0012635 A1* | 1/2018 | Quelen | G11C 5/147 |

OTHER PUBLICATIONS

Written Opinion for PCT Application No. PCT/US2017/041023 Issued by the U.S. International Searching Authority on Nov. 27, 2017; pp. 1-5.

* cited by examiner

Figure 6. Output Slew Circuit

View From Above

1. Main
2. Main Rectifier PGate
3. Sense MAIN
4. MAIN SWITCH PFET Gate Drive
5. RTimer
6. VCC
7. GND
8. VDD
9. AUX SWITCH PFET Gate Drive
10. Sense AUX
11. AUX Rectifier PGate
12. AUX
13. AUX UVP
14. AUX OVP
15. OVP MAIN
16. UVP MAIN

ELECTRONIC POWER SWITCH

TECHNICAL FIELD

Embodiments of the present invention are related to a power switch and, in particular, to an electronic power switch that switches power input voltages.

DISCUSSION OF RELATED ART

Many computing and electronics systems rely on the quality of its power supply for high performance characteristics. One method of increasing power reliability is by employing redundant sources, which are controlled by a power controller commonly referred to as a power multiplexor, or power MUX. A second power MUX application is employed for operation during a powered down state, as commonly happens in computing systems. That is, power is supplied from a main source during normal operation, but transferred to an auxiliary source during standby operation. This transfer from main to auxiliary and back should be smooth and timely, minimizing any voltage drops during transition, so that power flow and circuit operation are not interrupted. A third example of a power MUX application is integrating USB C connectors with other input voltage sources. In the third example, the voltage supplied can vary due to the source and load upstream and downstream of the connector.

Figure 1:
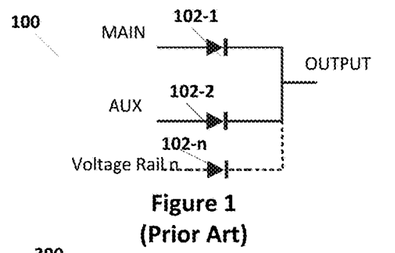
FIG. 1 illustrates a simple OR-ing circuit for selecting between power inputs.

There are a number of different circuits that have been used previously to provide for the function of switching between sources as smoothly as possible. One simple method is to use diodes from each source to the load, commonly called an ORing function. Such a system is illustrated in FIG. 1. As shown in FIG. 1, diodes 102-1 through 102-n to couple various power sources to a power output. However, the method illustrated in FIG. 1 can cause excess voltage drop, power dissipation in the diodes, and poor output voltage regulation.

A modification of the diode method is to use active control circuitry to turn on a power MOSFET or other devices such as bipolar junction transistors (BJTs), gallium nitride (GaN) transistors, to create a lower voltage drop "ideal" diode. One control method employs a comparator to sense voltage across the MOSFET to determine an on or off state. A positive voltage turns the MOSFET on, while a negative voltage turns it off. An improved method controls the MOSFET in a forward biased linear state. This avoids reverse current that is needed to trip turn-off in a comparator controlled MOSFET. However, with any diode, ideal or not, there is limited control over which source supplies the load. The higher of the two input sources supplies power. This is a problem in systems where the auxiliary source is higher in voltage than the main source.

Figure 2:
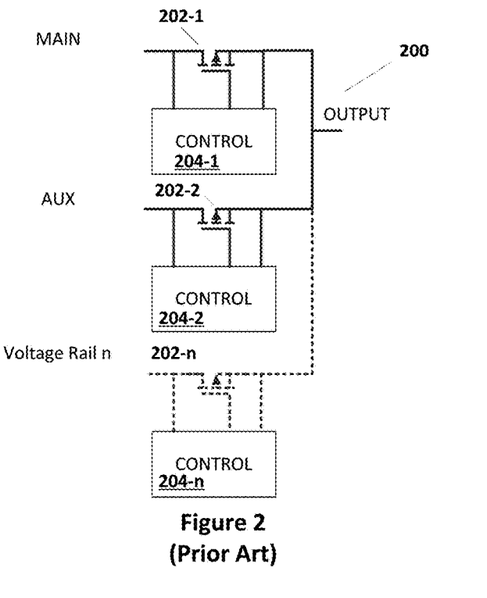
FIG. 2 illustrates on OR-ing circuit using MOSFETS for selecting between power inputs.
Figure 3:
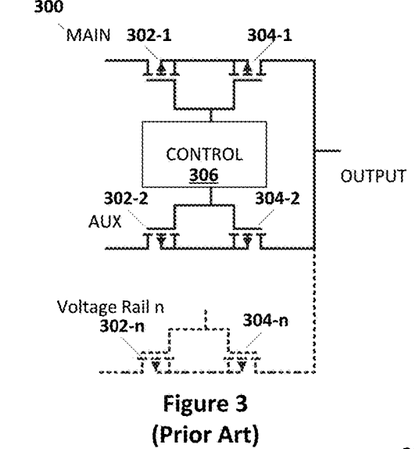
FIG. 3 illustrates a power mux using a bi-directional back-to-back MOSFET pairs with a single control per MOSFET pair.

FIG. 2 illustrates another switch 200 for switching between sources. As illustrated in FIG. 2, MOSFET switches 202-1 through 202-n are hard switched between inputs according to controllers 204-1 through 204-n. This is typically done by sensing main and auxiliary voltages and determining which of MOSFET switches 202-1 through 202-n to turn on. Most MOSFETs have an internal diode that allows current to flow when the voltage across the MOSFET is reversed. In order to prevent this reverse current from back feeding from one source to another, back-to-back MOSFETs are employed in series with each power source, with a single control signal, such as is illustrated in FIG. 3. As illustrated in FIG. 3, back-to-back MOSFETS 302 and 304—FIG. 3 illustrates MOSFETs 302-1 through 302-n coupled in series to MOSFETs 304-1 through 304-n, respectively, each pair coupled to an individual power sources. MOSFETs 302 and 304 are controlled by a control 306. Commutation of switches typically uses a "break before make" method. That is, one switch is turned off completely before the other is turned on.

However, this "break before make" method can be problematic. With both outputs temporarily off, there is no current flow to the load. Output load capacitance is used to hold up the load during this time, but the transition must be fast to minimize hold-up capacitance. The downside of this is that fast transitions create large step voltages that cause high charging currents in the output capacitors. This can overload or trip current limits in source supplies. Additionally, it can pull source voltages down enough to trip power good signals, halting system operation.

Some power MUX circuits mitigate these problems by separately controlling the back-to-back MOSFETs such that one functions as a diode and the other as an output control switch. Output voltage can be ramped at a controlled rate by using a capacitance from the output MOSFET gate to ground. Alternately, the output MOSFET is ramped up by a linear control circuit with a soft start capacitor.

Each of these methods can suffer from excessive delay times before the switch enables, particularly if the output voltage is at an intermediate point. In the case of the capacitor from MOSFET gate to ground, it takes time to charge the capacitor from 0V to the MOSFET threshold voltage, and even more to the intermediate output voltage. With the soft start circuit, the soft start capacitor ramps from 0V at a controlled rate until it "catches up" with the output voltage. Because of these delays, output voltage can sag excessively before the alternate source can turn on, negatively affecting system operation.

Finally, all of the control methodologies discussed so far are simplistic in nature. That is, they rely on simple comparators, timers, and logic for their decision making. This limits the ability to sequence events to effectively control switch operation under all conditions.

Figure 4:
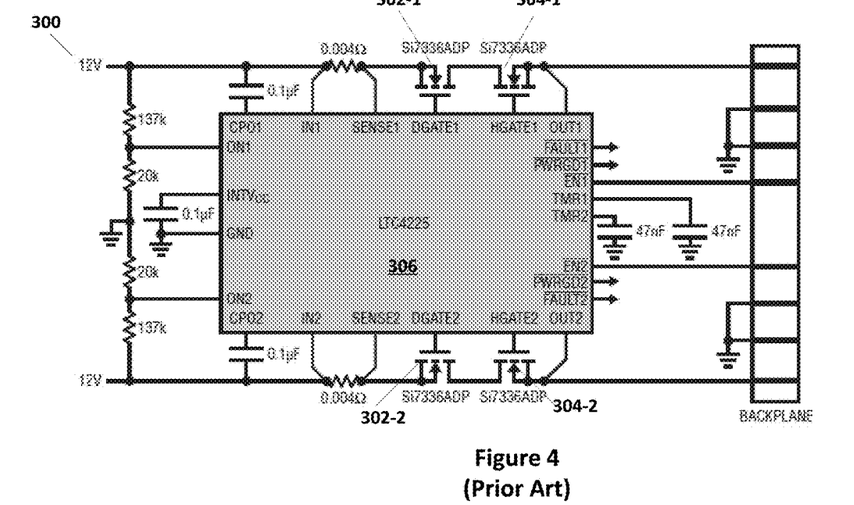
FIG. 4 illustrates a power mux using individually controlled back-to-back MOSFET pairs.

A good example of this is the controlling of back-to-back switches for two or more sources. This is often accomplished by an array of comparators, power good signals, slew circuits, timers, and external circuitry which must be optimized for each application (Reference LTC4228 and TPS25942). Such a system is illustrated in FIG. 4. Operation of one portion of the circuit can easily interfere with the operation of other interactive and associated circuitry.

Therefore, there is a need for systems that better control the voltages in a power supply.

SUMMARY

In accordance with aspects of the present invention, a power control circuit includes a MAIN window comparator circuit providing a MAIN signal; an AUX window comparator circuit providing an AUX signal; a state machine receiving the MAIN signal and the AUX signal; a MAIN slew circuit coupled to drive a MAIN switch, the MAIN switch coupled between MAIN and an output; an AUX slew circuit coupled to drive an AUX switch, the AUX switch coupled between AUX and the output; wherein the state machine operates to continuously activate either the MAIN switch or the AUX switch according to the MAIN signal and the AUX signal such that the output is continuously coupled to either a MAIN input or an AUX input with minimum disruption to output voltage, input and output capacitance inrush currents or reverse conduction. What really makes the circuit unique is it is combined with an adjustable forward biased rectification circuit for each channel of MAIN and AUX.

These and other embodiments are further discussed below with respect to the following figures.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

Elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

Embodiments of the present invention includes an electronic power switch that monitors more than one DC input voltage and outputs one or more DC voltages based on the DC input voltages to one or more loads as appropriate. A processor operating according to a state machine provides for decision making and control. Transitions from one input voltage to the other input voltage are smooth and controlled. A current path to the output from one of the inputs is continuously maintained to avoid output voltage interruptions. Overlap time between input voltages is adjustable. Applications include computing, telecommunications, industrial, automotive, and aerospace equipment.

Consequently, embodiments of the present invention can provide a more flexible and capable control system where the output configuration is always in a known and controlled state. Some embodiments of the invention provide a power switch control method that guarantees an overlap time during transition so that output voltage sag is minimized. In some embodiments, a slew controlled circuit allows the alternate source switch to turn on in a timely manner, minimizing output voltage sag during transition.

Embodiments of the present invention address the limitations discussed above with conventional systems with a unique combination of control methodology and circuit implementation. As discussed above, FIG. 1 shows a conventional simple diode OR-ing circuit. FIG. 2 shows the use of MOSFETs in an OR-ing configuration as another example of a conventional system. FIG. 3 shows a conventional power MUX with pairs of MOSFETs employed in a bidirectional switch configuration with single control per MOSFET pair. FIG. 4 shows an example of a conventional power MUX using pairs of MOSFETs with individually controlled MOSFETs.

Figure 5:
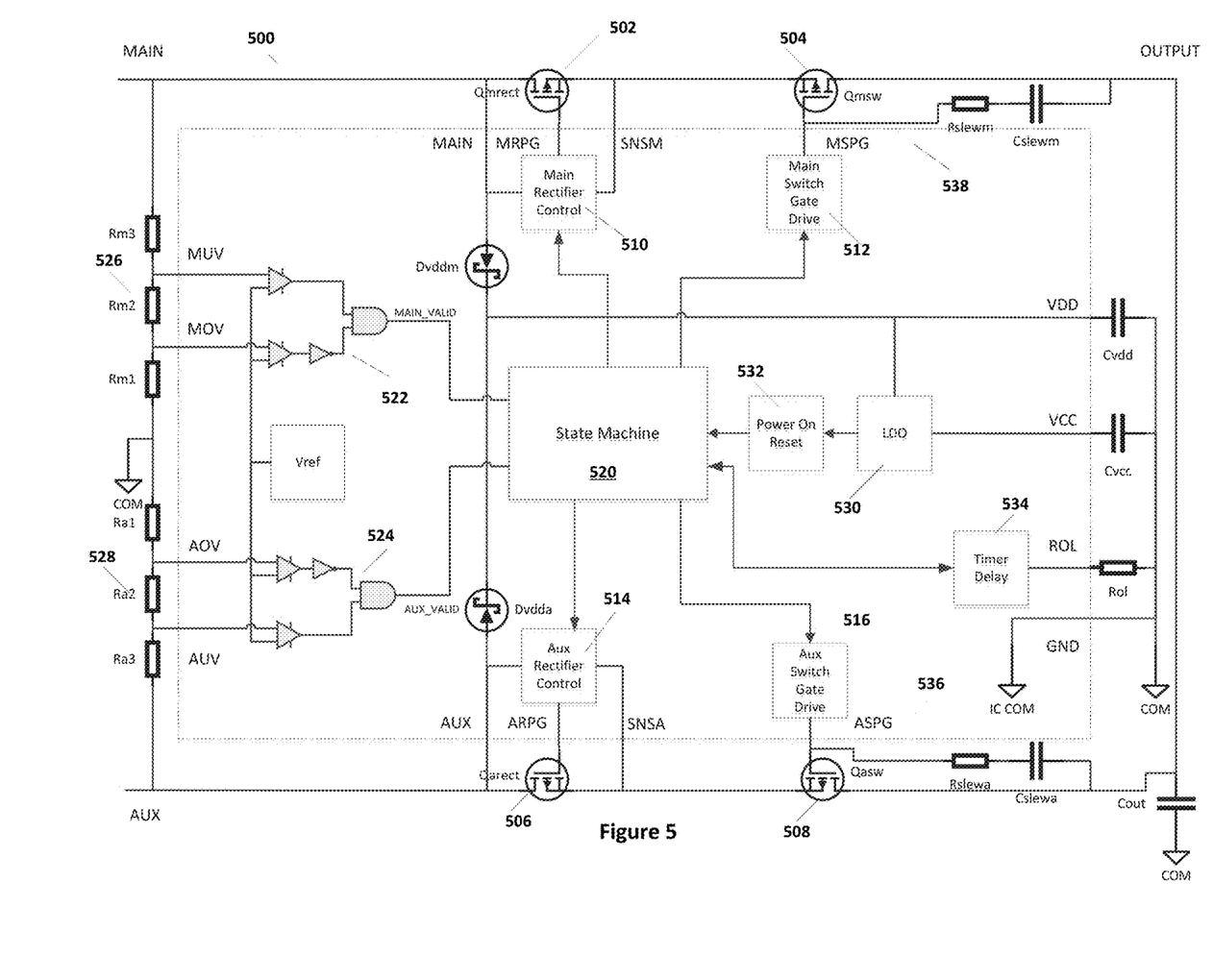
FIG. 5 illustrates a power mux according to some embodiments of the present invention.

FIG. 5 shows an embodiment of the present invention. P channel MOSFETs 502, 504, 506, and 508 are used in this implementation, though N channel MOSFETs could be used as well, as would be understood by those skilled in the art. As illustrated in FIG. 5, MOSFETs 502 and 504 are coupled to provide a MAIN power supply and MOSFETs 506 and 508 are coupled to provide an AUX power supply. MAIN is the main input power source and AUX is the auxiliary power source.

An input divider 526 from MAIN is fed into a window comparator 522 to determine if MAIN is within acceptable voltage limits. Likewise, an input divider 528 from AUX is fed into a second window comparator to determine if AUX is within acceptable limits.

A state machine 520 is used for the control of the power MUX 500. Power to the state machine 520 is supplied by an internal linear regulator (LDO) 530, with a power on reset (POR) 532 circuit to determine if sufficient supply voltage is available for operation. Control inputs to the state machine 520 are the POR signal from POR 532, the two window comparator signals from window comparators 522 and 524, and a time delay signal from a Timer Delay circuit 534.

Control outputs from the state machine are Timer Delay initiation signal to time delay circuit 534, MAIN signals to Main Switch Gate Drives 510 and 512, and AUX signals to Aux Switch Gate Drive 514 and 516.

Decision making of state machine 520 and its synchronous and asynchronous outputs can be configured externally one or more times and alternatively can be held in volatile or non-volatile memory on board the chip.

State machine 520 can be software driven operating on a processor system. The processor system includes microprocessors, memory, and other circuits for operating a processor. Alternatively, state machine 520 may be operated on fixed circuitry.

Qmrect 502 is a controlled rectifier employing a MOSFET operating in a linear biased mode. This provides the forward rectifier function for the MAIN input. Qarect 506 is a second controlled rectifier employing a MOSFET operating in a linear biased mode. This provides the forward rectifier function for the AUX power input. Qmnrect 502 and Qarect 406 are driven by Main rectifier control 510 and Aux rectifier control 514, respectively. Gate drive 510 receives signals from MAIN power input and from state machine 520. Gate driver 514 receives input signals from AUX input and from state machine 520. In some embodiments, operation of Qmrect and Qarect are autonomous from a control signal perspective in that they are not controlled by the state machine 520 and operate independently of each other. In some embodiments, the state machine can vary the amount of forward voltage across each of the transistors 502 and 506 through rectifier controls 510 and 514. For example, in USB-PD applications the diode functions of transistors 502 and 506 can be overridden and reverse current allowed. The Timer Delay 534 receives an initiation signal from the state machine 520 and returns a signal when the time delay period is complete. Delay value is adjustable via an external resistor Rol.

Qmsw 504 is the output control switch for the MAIN power source. Qasw 508 is the output control switch for the AUX source. As illustrated in FIG. 5, Qmsw 504 is coupled to a slew circuit 538 that includes a switch gate drive 512. Qasw 508 is coupled to a slew circuit 536 that includes gate driver 516. Gate drive 512 and gate drive 516 receive signals from state machine 520.

Figure 6:
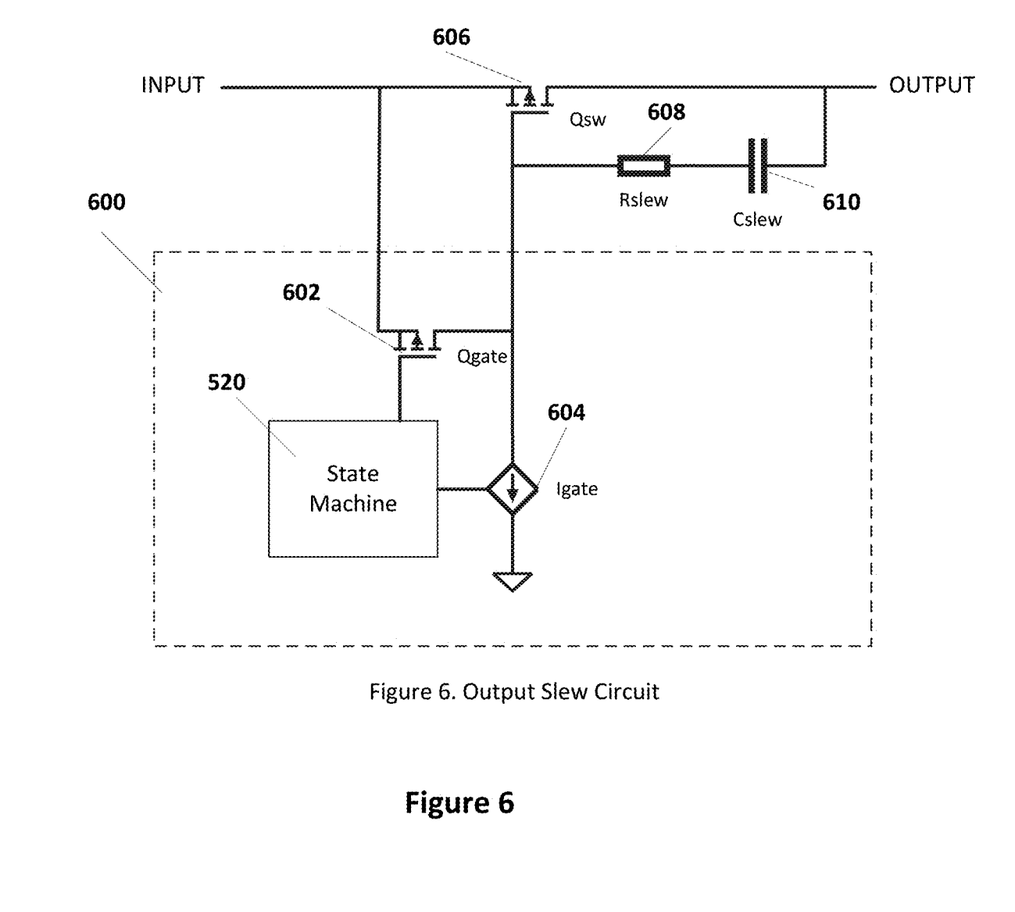
FIG. 6 illustrates an output skewing circuit according to some embodiments of the present invention.

FIG. 6 shows an example slew circuit 600, which may be slew circuit 536 and 538, in more detail. As shown in FIG. 6, state machine 520 is coupled to a driver 602 and current control circuit 604. Driver 602 is coupled to the gate of Qsw 606, which can be Qasw 508 or Qmsw 504. A serially coupled resistor 608 and capacitor 610, coupled between the gate of Qsw 606 and the output, completes the slew circuit.

Operation of the MAIN slew circuit 538 and AUX slew circuit 536 is similar, though the slew rates and threshold values may be adjusted independently of each other. Output slewing circuits are common in this application to allow a controlled OUTPUT rise time. This eliminates OUTPUT voltage overshoot, as well as limits the charging current in Cout.

When the output is disabled, Qsw gate 606 is pulled high by Qgate 602 and the MOSFET is off. No power is permitted to flow from the input to the output through Qsw 606.

To enable Qsw, Qgate 602 is turned off. Current source Igate 604 is enabled and begins to charge the gate of Qsw 606. Igate 604 value is sufficient to turn on Qsw typically within a few microseconds.

Cslew 610 is connected between the gate of Qsw 606 and drain (via Rslew 608), in a form commonly referred to as a Miller capacitor. Once the gate of Qsw 606 reaches a threshold, its drain voltage (and hence, OUTPUT voltage) slews according to the standard formula:

$$dv/dt = Igate/Cslew$$

Rslew 608 is inserted in series with Cslew 610 to allow the gate voltage of Qsw 606 to achieve its gate threshold voltage Vgth quickly, without having to charge Cslew. A typical value for Rslew is:

$$Rslew = Vgth/Igate$$

The combination of these components provides a significant advantage over other slewing circuits. In normal operation, the voltage across Cslew 610 is not set to 0V when Qsw 606 is off as with prior art circuits. Rather, it is operating at a steady state voltage determined by Vout. Because of this, Cslew 610 can immediately be employed to control the output slew rate without having to first be charged from 0V.

Because of this capability, transferring output power from one input source to another can begin with minimal delay and minimal voltage sag on the output. For example, if MAIN voltage is dropping, AUX can begin ramping quickly to support output voltage continuity. OUTPUT capacitance Cout can be reduced, saving cost and space.

Figure 7:
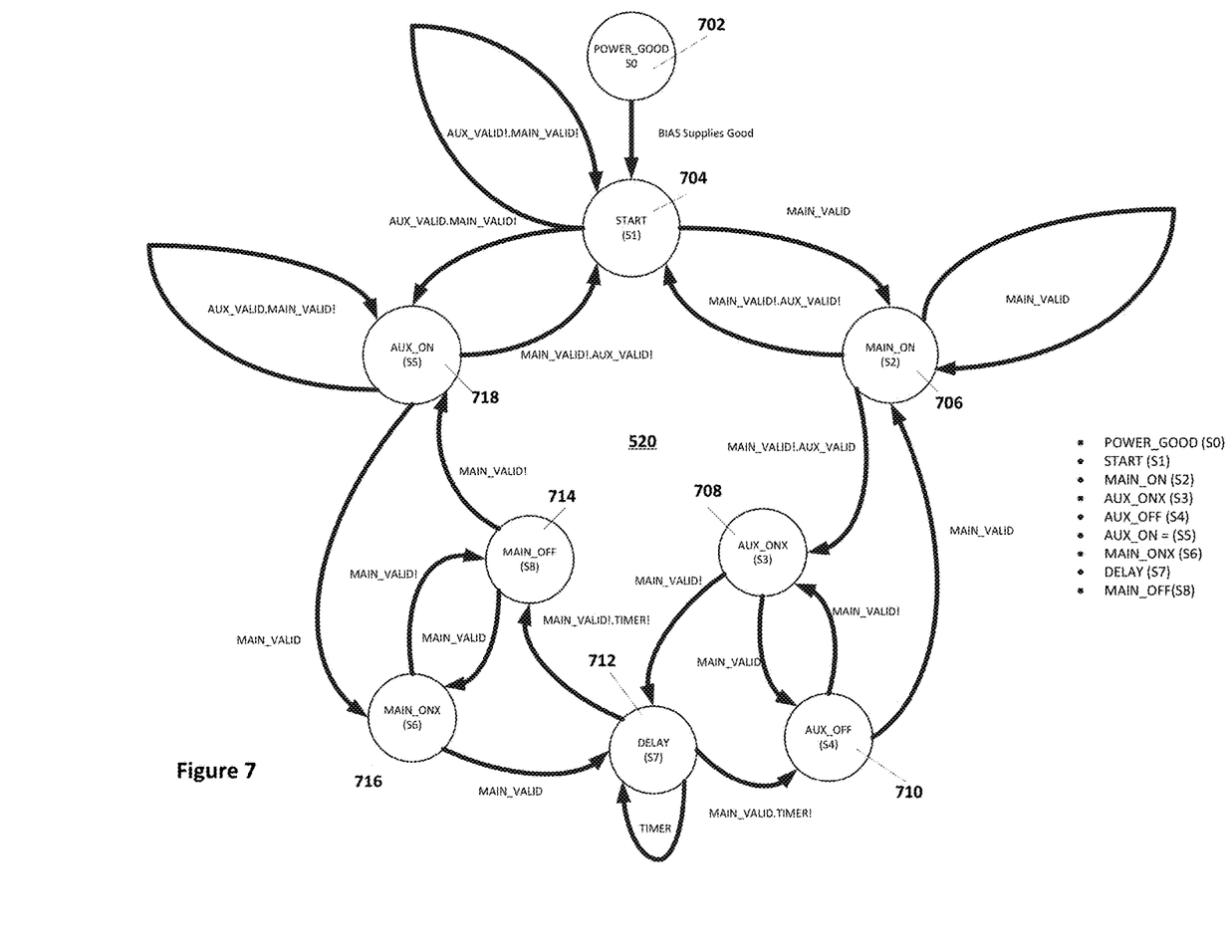
FIG. 7 illustrates a state machine operating on the embodiment illustrated in FIG. 5.

FIG. 7 shows the state machine 520 in one embodiment of the invention. The flow of state machine 520 is provided below.

POWER GOOD (S0) 702. When internal bias supplies are within regulation, a POWER GOOD is asserted and the state machine moves to START state 704.

START (S1) 704. From START 704, the state machine looks for MAIN and AUX status from the window comparators 522 and 524 previously described. If neither is valid, no change is made. If MAIN is valid as indicated by comparator 522, the state moves to MAIN_ON 706. If MAIN is not valid, but AUX is valid as indicated by comparator 524, the state moves to AUX_ON 718.

MAIN_ON (S2) 706. MAIN_ON 706 enables the MAIN switch gate drive 512, which turns on Qmsw 504. The output voltage slews up at a rate determined by Cslewm, and MAIN becomes fully connected to OUTPUT. As long as MAIN remains valid, the machine remains in this state.

AUX_ONX (S3) 718. If MAIN becomes invalid, but AUX is still valid, then the state moves to AUX_ONX 718. AUX switch gate drive 516 is enabled and the output begins to slew toward the AUX voltage value. During this time, both MAIN and AUX switches are enabled, so there is always power flow to the OUTPUT. This minimizes voltage sag during transition from one source to the other.

AUX_OFF (S4) 710. If in the meantime, MAIN becomes valid again, the state moves to AUX_OFF and the AUX switch is turned off. OUTPUT remains supplied by MAIN and the state returns to S2. However, if MAIN remains invalid, then the state moves to DELAY (S7) 712.

DELAY (S7) 712. In this state, both MAIN and AUX switches remain on for the duration of S7. This provides a defined overlap time, which is determined by Rol. The length of overlap required is set to be sufficient to allow time for AUX to slew, plus any additional time desired.

At the end of S7, if MAIN is still invalid, then the state moves to MAIN_OFF (S8) 714. If MAIN has become valid again, the state moves back to S4 and the AUX switch is disabled.

MAIN_OFF (S8) 714. MAIN_OFF disables the MAIN switch, and OUTPUT is supplied only by AUX. If MAIN remains invalid, the state proceeds to AUX_ON (S5) 718. If MAIN becomes valid again, the state moves to MAIN_ONX (S6) 716.

AUX_ON (S5) 708. In the AUX_ON state 718, the AUX switch remains enabled until a change of input status. If MAIN remains invalid and AUX becomes invalid, the state returns to START (S1) 704. If MAIN becomes valid, the state moves to MAIN_ONX (S6) 716.

MAIN_ONX (S6) 716. In this state, the MAIN switch gate drive is enabled and the transition back to MAIN input begins. Qmsw turns on and ramps the output back to the MAIN source voltage level. If main becomes invalid in the meantime, the state moves to S8 and MAIN switch is disabled, returning to MAIN_OFF 718 S5. However, if MAIN remains valid, the state moves again to S7 712. This provides an overlap time for transition back to the MAIN input source as was used in the transition from MAIN to AUX. If MAIN remains valid at the end of the delay, the state moves to S4 and then to S2.

There are distinct advantages to this method. First, control is always in a known state, minimizing glitches and errors. Second, there is always at least one switch connected from either MAIN or AUX to the output. There is never a state where one of the switches is not connected, unless there is no power on either input or the power is not valid in either condition. Reliability and continuity of power maximized.

Third, the overlap allows for both sources to supply during the transition time, ensuring a smooth transition with minimum output voltage sag. Voltage sag is further reduced by the previously described slew circuit, which minimizes delay time before the enabled switch can begin ramping to it full voltage.

Finally, once the delay timer is finished, only one output remains on. This allows the system to use MAIN to supply the OUTPUT, even if the AUX input voltage is higher.

In addition, we can modify the forward voltage Vf as exhibited across the Qmrect and Qarect as a function of the state as determined by the state machine. This will allow us to lower voltage drop when the machine is in a full conduction state, that condition being MAIN_ON or AUX_ON. The voltage Vf as exhibited across the Qmrect and Qarect can vary in different state machine states to allow for a reduction in reverse conduction time.

The state machine/processor 520 can be operated by a continuous clock, a clock that is event driven for a predetermined amount of time or cycles or purely asynchronously. These are not the only states that could be employed in circuit operation. Other inputs, states and decision outputs can be included as necessary for the application, as can be understood by those skilled in the art.

Figure 8:
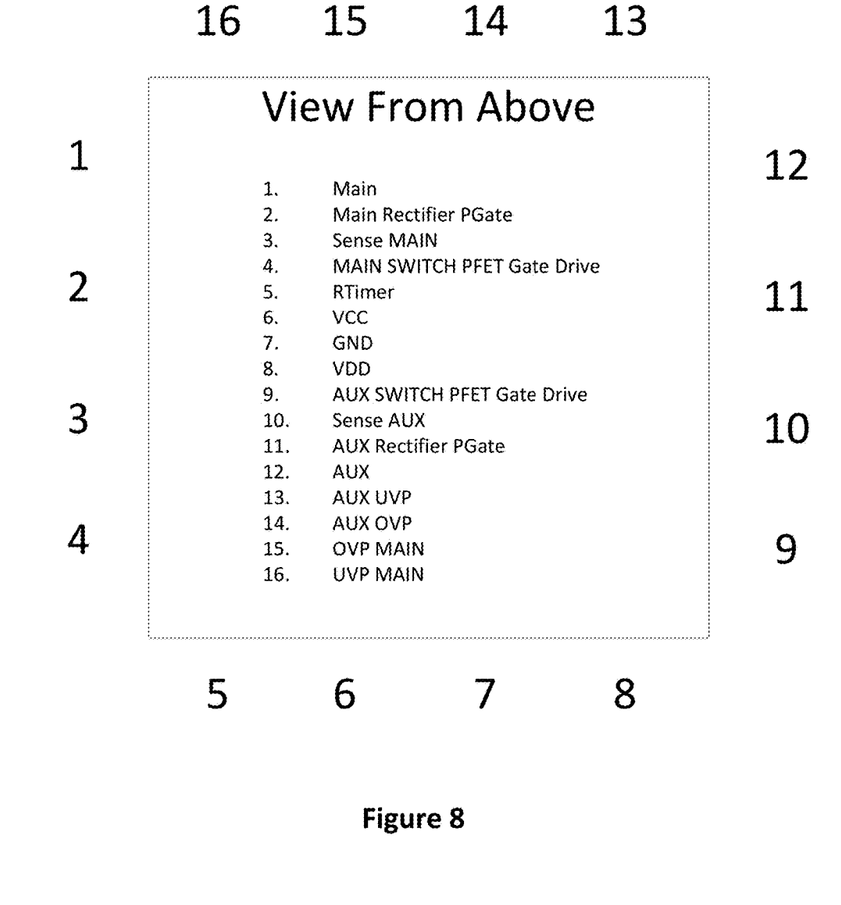
FIG. 8 illustrates an example pin configuration for an embodiment of the present invention.
Figure 9:
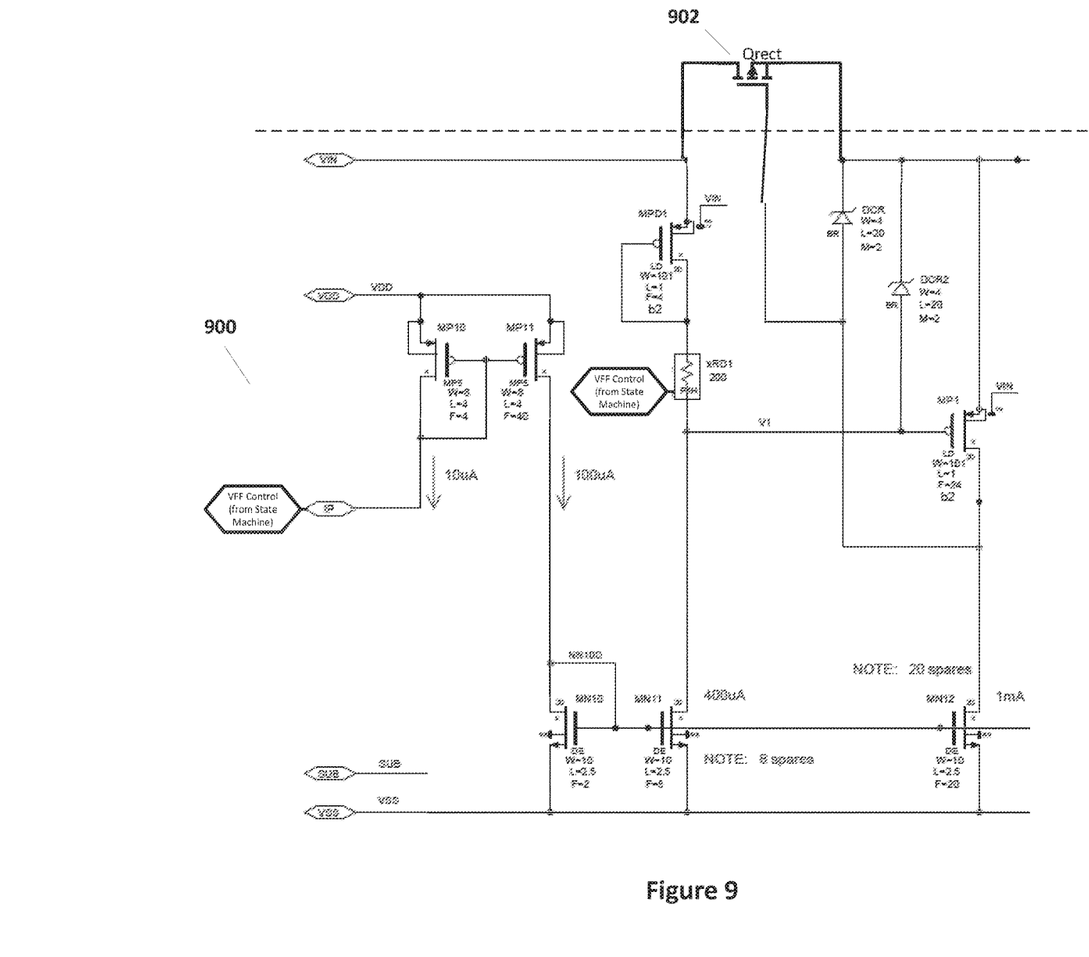
FIG. 9 illustrates an example of a rectifier control block as illustrated in FIG. 5.

FIG. 8 illustrates an example pin connection map that can be employed. As is illustrated, circuit 500 can be implemented in a 16 pin package. FIG. 9 illustrates an example of rectifier control 510 or 514.

FIG. 9 illustrates an example of a rectifier control block 900 that can be used as either main rectifier control 510 or auxiliary rectifier control 514 as illustrated in FIG. 5. As is illustrated, rectifier control block 900 controls a corresponding rectifier transistor 902 according to control signals from state machine 522.

The above detailed description is provided to illustrate specific embodiments of the present invention and is not intended to be limiting. Numerous variations and modifications within the scope of the present invention are possible. The present invention is set forth in the following claims.

What is claimed is:

1. A power control circuit, comprising:
   a MAIN output transistor coupled to a MAIN voltage to selectively supply an output voltage from the MAIN voltage,
   a MAIN slew circuit coupled to drive the MAIN output transistor, the MAIN slew circuit comprising a series coupled MAIN slew capacitor and MAIN slew resistor coupled between the output voltage and a gate of the MAIN output transistor, a MAIN switch transistor coupled between the gate of the MAIN output transistor and the MAIN voltage, and a current source coupled between the gate of the MAIN output transistor and ground;
   an AUX output transistor coupled to an AUX voltage to supply the output voltage from the AUX voltage;
   an AUX slew circuit coupled to drive the AUX output transistor, the AUX slew circuit comprising a series coupled AUX slew capacitor and AUX slew resistor coupled between the output voltage and a gate of the AUX output transistor, an AUX switch transistor coupled between the gate of the AUX output transistor and the AUX voltage, and an AUX current source coupled between the gate of the AUX output transistor and ground;
   a MAIN window comparator circuit providing a MAIN signal;
   an AUX window comparator circuit providing an AUX signal;
   a state machine receiving the MAIN signal and the AUX signal, the state machine coupled to a gate of the MAIN switch transistor and a gate of the AUX switch transistor;
   wherein the state machine operates to continuously activate either the MAIN switch transistor or the AUX switch transistor according to the MAIN signal and the AUX signal such that the output is continuously coupled to either the MAIN voltage or the AUX voltage, and
   wherein a MAIN slew voltage remains across the MAIN slew capacitor when the AUX switch transistor is active and an AUX slew voltage remains across the AUX slew capacitor when the MAIN switch transistor is active so that transitions between the MAIN voltage and the AUX voltage are smooth.

2. The circuit of claim 1, wherein the MAIN signal is valid if a main voltage is within acceptable limits.

3. The circuit of claim 1, wherein the AUX signal is valid if an auxiliary voltage is within acceptable limits.

4. The circuit of claim 1, wherein the state machine includes
   a start state initiated when power is applied, during the start state the state machine determines status of the MAIN signal and the AUX signal;
   a main-on state that is transitioned to when the MAIN signal is valid; and
   an aux-on state that is transitioned to when the AUX signal is valid and the MAIN signal is invalid.

5. The circuit of claim 4, wherein the state machine further includes an aux onx state that is transitioned to from the main-on state when the MAIN signal becomes invalid and the AUX signal remains valid.

6. The circuit of claim 5, wherein the state machine further includes an aux off state that is transitioned to from the aux onx state when the MAIN signal becomes valid, the aux off state transitions to the main-on state while the MAIN signal is valid.

7. The circuit of claim 6, wherein the state machine further includes a main onx state that is transitioned to from the aux-on state when the MAIN signal becomes valid.

8. The circuit of claim 7, wherein the state machine further includes a main-off state that is transitioned to from the main onx state when the MAIN signal becomes invalid.

9. The circuit of claim 8, wherein the state machine includes a delay state that is transitioned to from the Aux onx state or the main onx state and which activates the MAIN slew circuit and the AUX slew circuit so that a smooth transition can be made between main and auxiliary power.

10. The circuit of claim 4, further including transitioning to from the MAIN-on state to the AUX-on state when the MAIN signal becomes invalid and the AUX signal remains valid.

11. The circuit of claim 10, further including transitioning to an AUX-off state from the AUX-on state when the MAIN signal becomes valid and then to the MAIN-on state when the MAIN signal becomes valid.

12. The circuit of claim 11, further including transitioning to the MAIN-on state from the AUX-on state when the MAIN signal becomes valid.

13. The circuit of claim 12, further including transitioning to a MAIN-off state from the MAIN-on state when the MAIN signal becomes invalid.

14. The circuit of claim 13, further including transitioning to a delay state from the AUX-on state or the MAIN-on state, the delay state activating the MAIN slew circuit and the AUX slew circuit so that a smooth transition can be made between main and auxiliary power.

15. A method of switching a power supply between a main power input voltage and an auxiliary power input voltage, comprising determining a MAIN signal that is valid if a main power input voltage is within acceptable limits;

determining an AUX signal that is valid if an auxiliary power input voltage is within acceptable limits;

controlling a MAIN slew circuit to transition to a MAIN-on state when the MAIN signal is valid, the MAIN slew circuit comprising a series coupled MAIN slew capacitor and MAIN slew resistor coupled between an output voltage and a gate of a MAIN output transistor coupled between the main input voltage and the output voltage, a MAIN switch transistor coupled between the gate of the MAIN output transistor the MAIN power input voltage, and a current source coupled between the gate of the MAIN output transistor and ground, and where controlling the MAIN slew circuit to the main-on state includes activating the MAIN switch transistor; and controlling an AUX slew circuit to transition to an AUX-on state when the MAIN signal is not valid and the AUX signal is valid, the AUX slew circuit comprising a series coupled AUX slew capacitor and AUX slew resistor coupled between an output voltage and a gate of an AUX output transistor coupled between the main input voltage and the output voltage, an AUX switch transistor coupled between the gate of the AUX output transistor and the AUX power input voltage, and a current source coupled between the gate of the AUX output transistor and ground, and where controlling the AUX slew circuit to the main-on state includes activating the AUX switch transistor, wherein a MAIN slew voltage remains across the MAIN slew capacitor when the AUX switch transistor is active and an AUX slew voltage remains across the AUX slew capacitor when the MAIN switch transistor is active so that transitions between the MAIN voltage and the AUX voltage are smooth.

\* \* \* \* \*